United States Patent
Caggiano et al.

(10) Patent No.: US 7,580,232 B2
(45) Date of Patent: Aug. 25, 2009

(54) ARC DETECTION SYSTEM AND METHOD

(75) Inventors: Robert J. Caggiano, Wolcott, CT (US); Thangavelu Asokan, Bangalore (IN); Satyanarayana Murphy Ungarala, Andhra Pradesh (IN); George William Roscoe, West Hartford, CT (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/962,384

(22) Filed: Dec. 21, 2007

(65) Prior Publication Data

US 2009/0161272 A1   Jun. 25, 2009

(51) Int. Cl.
*H02H 3/00* (2006.01)
*H02H 7/00* (2006.01)
*H02H 9/08* (2006.01)

(52) U.S. Cl. .................... 361/5; 361/2; 361/3; 361/42; 361/78

(58) Field of Classification Search ................ None
See application file for complete search history.

(56) References Cited

U.S. PATENT DOCUMENTS

| 5,443,642 | A | * | 8/1995 | Bienduga | 118/688 |
| 5,933,308 | A | | 8/1999 | Garzon | |
| 5,940,547 | A | | 8/1999 | Schumacher et al. | |
| 6,141,192 | A | * | 10/2000 | Garzon | 361/5 |
| 6,876,203 | B2 | | 4/2005 | Blades | |
| 2007/0262780 | A1 | * | 11/2007 | Mernyk et al. | 324/509 |
| 2008/0094612 | A1 | * | 4/2008 | Land | 356/51 |
| 2008/0106753 | A1 | * | 5/2008 | Wayman et al. | 358/1.14 |

* cited by examiner

*Primary Examiner*—Albert W Paladini
*Assistant Examiner*—Dharti H Patel
(74) *Attorney, Agent, or Firm*—Patrick K. Patnode (57) ABSTRACT

A system for identifying an arcing event in electrical distribution systems is provided. The system comprises a sensor configured to detect ultraviolet light and to generate a signal indicative of the arcing event propagating from the electrical distribution system. A processor coupled to the sensor and configured to analyze an ultraviolet light characteristic from the signal and generate an arc fault signal. A protective device configured to receive the arc fault signal and to mitigate the arcing event in the electrical distribution system.

25 Claims, 5 Drawing Sheets

ARC DETECTION SYSTEM AND METHOD

BACKGROUND

The present invention is generally related to electrical arc detection, more particularly to optical signal detection during arcing fault in electrical distribution systems.

Arc flash is the result of a rapid energy release due to an arcing fault between phase conductors, phase and neutral conductors, or phase and ground conductors. An arc flash can produce high heat, intense light, pressure waves, and sound/shock waves similar to that of an explosion. However, the arcing fault current is usually lower than a short circuit or bolted fault current, and hence delayed or no tripping of circuit breakers is expected unless the breakers are selected that are designed to handle an arcing fault condition.

Detection of arc flash, indicative of an arcing event, can be useful in mitigating the undesirable arcing conditions in electrical system or equipment, such as electrical distribution equipment or systems. One known technique for detecting arcing events involves the use of optical detectors to detect visible light and thereby to sense the arc flash associated with an arcing event. However, this technique may give raise to erroneous detection as the sensors may detect undesirable light from other sources such as lamps and even daylight. Another technique is to use current monitors to evaluate current perturbations in a conductor indicative of an arcing event. However, this technique may require onerous processing demands resulting in an undesirably long reaction time for identifying an arcing event. Another technique is to use pressure sensors to monitor the increase in pressure indicative of an arcing event. However, this technique may require significant time before pressure increases to actionable levels, resulting in long reaction time in mitigating an arcing event.

Therefore, there is a need for arc flash detection technique that provides reliable and early detection and effective mitigation to avoid damage to electrical equipments and to protect the personnel.

BRIEF DESCRIPTION

Briefly a system for identifying an arcing event in electrical distribution systems is provided. The system comprises a sensor configured to detect ultraviolet light and to generate a signal indicative of the arcing event propagating from the electrical distribution system. A processor coupled to the sensor and configured to analyze an ultraviolet light characteristic from the signal and generate an arc fault signal. A protective device configured to receive the arc fault signal and to mitigate the arcing event in the electrical distribution system.

In another embodiment, an arc detection system for identifying an arcing event within an electrical distribution system is provided. The system comprises a plurality of optical sensors disposed proximate electrical distribution system and configured to sense an ultraviolet light and to generate a first signal indicative of an arcing event generated in the electrical distribution system. A plurality of radio frequency sensors are disposed proximate electrical distribution system and configured to sense a radio frequency signal indicative of an arcing event generated in the electrical distribution system. A processor is coupled to the optical sensors and radio frequency sensors and is configured to extract an ultraviolet light characteristic from first signal, and a radio frequency characteristic from radio frequency signal, and to compare the extracted characteristics and a pre-determined characteristic to identify occurrence of an arcing event. An arc fault signal may then be generated and communicated to a protective device that is configured to receive the arc fault signal and to mitigate the arcing event in the electrical distribution system.

A method for identifying an arcing event in electrical distribution system is also provided. The method comprises detecting an ultraviolet light and generating a signal indicative of an arcing event generated by electrical distribution system and propagating from electrical distribution system. An ultraviolet light characteristic is extracted from the signal and compared to a pre-determined ultraviolet light characteristic to identify occurrence of an arcing event. An arc fault signal is generated indicative of occurrence of the arcing event.

In another embodiment, a method for identifying an arcing event in electrical distribution system comprises detecting an ultraviolet light and generating a first signal indicative of the arcing event, and detecting a radio frequency signal indicative of the arcing event propagating from electrical distribution system. An ultraviolet light characteristic is extracted from the detected first signal and a radio frequency characteristic is extracted from the detected radio frequency signal. The extracted ultraviolet light characteristic and radio frequency characteristic are compared to a pre-determined characteristic to identify occurrence of an arcing event. An arc fault signal is generated indicative of occurrence of the arcing event.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
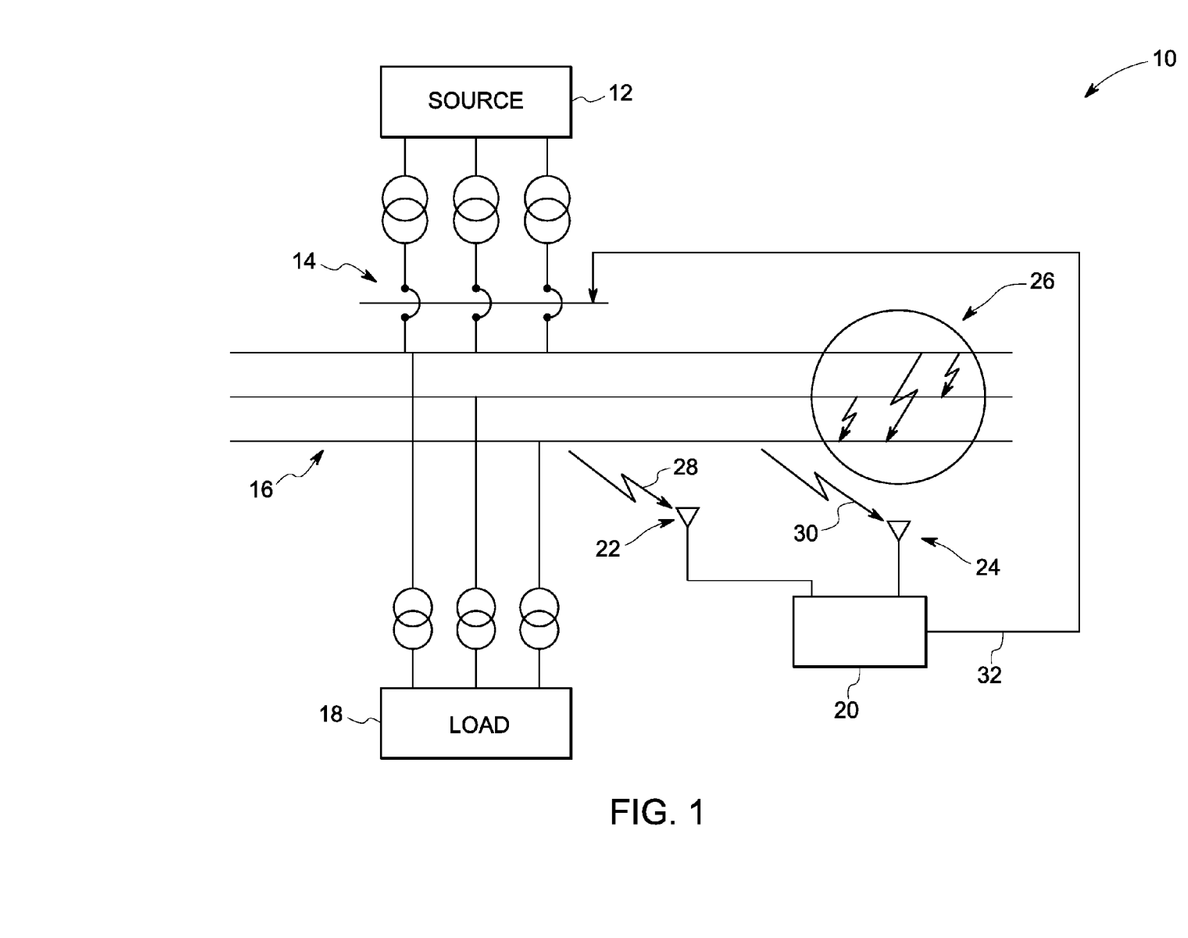
FIG. 1 is a schematic representation of an exemplary electrical distribution system illustrating an arcing event and an arc flash detection system.

FIG. 1 is a schematic diagram of an exemplary electrical distribution system 10. Typically the electrical distribution system comprises an electrical power source 12, protective device 14, bus bars 16 and load 18. According to one embodiment of the present invention an arc flash detection system 20 is implemented. Optical detectors 22 and 24 are coupled to the arc flash detection system 20 and configured to detect an arcing event 26. An example of an electrical power source 12 may be a generator configured to deliver electrical power through a protective device such as protective device 14 to bus bars 16. An example of a protective device 14 may be an arc mitigating device or a circuit breaker that may be operated through electrical command signals. Load 18 coupled to the bus bars may be a motor capable of receiving electrical power.

An arcing event or arc flash may occur in any part of the system 10 between at least two current carrying bus bars/ conductors. Also the arcing event may occur between current carrying bus bars/conductor and ground or a neutral conductor. The location of arc flash occurrence may generally be categorized as a closed location or an open location. Closed locations might include panel boards or enclosed switchgear panels or the electrical distribution system. Open locations are regions that are exposed to the environment outside the enclosure, such as the bus bars or electrical leads that connect the switchgear or panels from electrical source to the load. Arcing faults occur largely due to the clearance between phase conductors, or between phase and ground conductors. However, arc flash may occur anywhere from the electrical source to the load. Clearance can be affected by several factors, including environmental conditions (e.g., humidity, or conducting particles in polluted environment), insulation failure, a foreign object falling between the conductors (e.g., a tool dropped by a technician).

An example of one such arcing event is illustrated by the reference numeral 26 that may emit light and other components (e.g., vaporized matter). The optical sensors 22 and 24 are configured to detect ultraviolet light emission such as 28 and 30 from the arcing event. The arc flash detection system 20 may be configured to receive signals from the optical sensors, and process the signals further to verify an arcing event. The system 20 may be configured to generate an arc alarm signal 32 indicative of an arcing event. Signal 32 may be coupled to the protective device 14 that is capable of interrupting power.

In another embodiment of the present invention, the sensors 22 and 24 may be radio frequency sensors configured to detect radio frequency signals such as 28 and 30 emitted from the arcing event 26. The arc flash detection system 20 may be configured to receive signals from the radio frequency sensors, and process the signals further to verify an arcing event. The system 20 may be configured to generate an arc alarm signal 32 indicative of an arcing event. Signal 32 may be coupled to the protective device 14 that is capable of interrupting power.

In a conventional system, two categories of protective devices typically are used for mitigating the arc flash; series devices such as circuit breakers or fuses, and parallel devices such as a "crowbar" (that effectively provoke opening of a circuit). The series devices are conventional and are not satisfactory due to their slow reaction and operation time. The crowbar devices suffer from similar drawbacks, and may actually establish harmful faults.

In another embodiment of the present invention, the sensors 22 and 24 may be optical sensors and radio frequency sensors, respectively, configured to detect ultraviolet light 28 and radio frequency signals 30 emitted from the arcing event 26. The arc flash detection system 20 may be configured to receive signals from the optical sensors and radio frequency sensors and to process further to verify an arcing event. The system 20 may be configured to generate an arc alarm signal 32 indicative of an arcing event. Signal 32 may be coupled to the protective device 14 that is capable of interrupting power.

Sensors such as sensors 22 and 24 as noted above may be disposed in the electrical distribution system. Although two such sensors are discussed in the present description, more or fewer sensors may be employed. In the illustrated embodiment of the invention, the sensors may be photodiodes. Such photodiodes are semiconductor diodes that are configured to function as photo-detectors. Photodiodes are packaged with either a window or optical fiber connection, to let in the light to the device. The optical/light signals are converted in electrical signals by the photodiodes. The intensity of input light may be proportional to the electric signals output by the diodes. In another embodiment of the invention, the sensors may fiber optic sensors. Such fiber optic sensors typically comprise of a fiber optic cable connected to an amplifier. The fiber optic sensor receives and converts the light energy into an electrical signal. Fiber optic cable consists of a plastic or glass core surrounded by a layer of cladding material. The principle of total internal reflection upon which the fiber optic sensors work is achieved by the difference in densities or refractive indices between these two components such as the plastic or glass core and a layer of cladding material.

Figure 2:
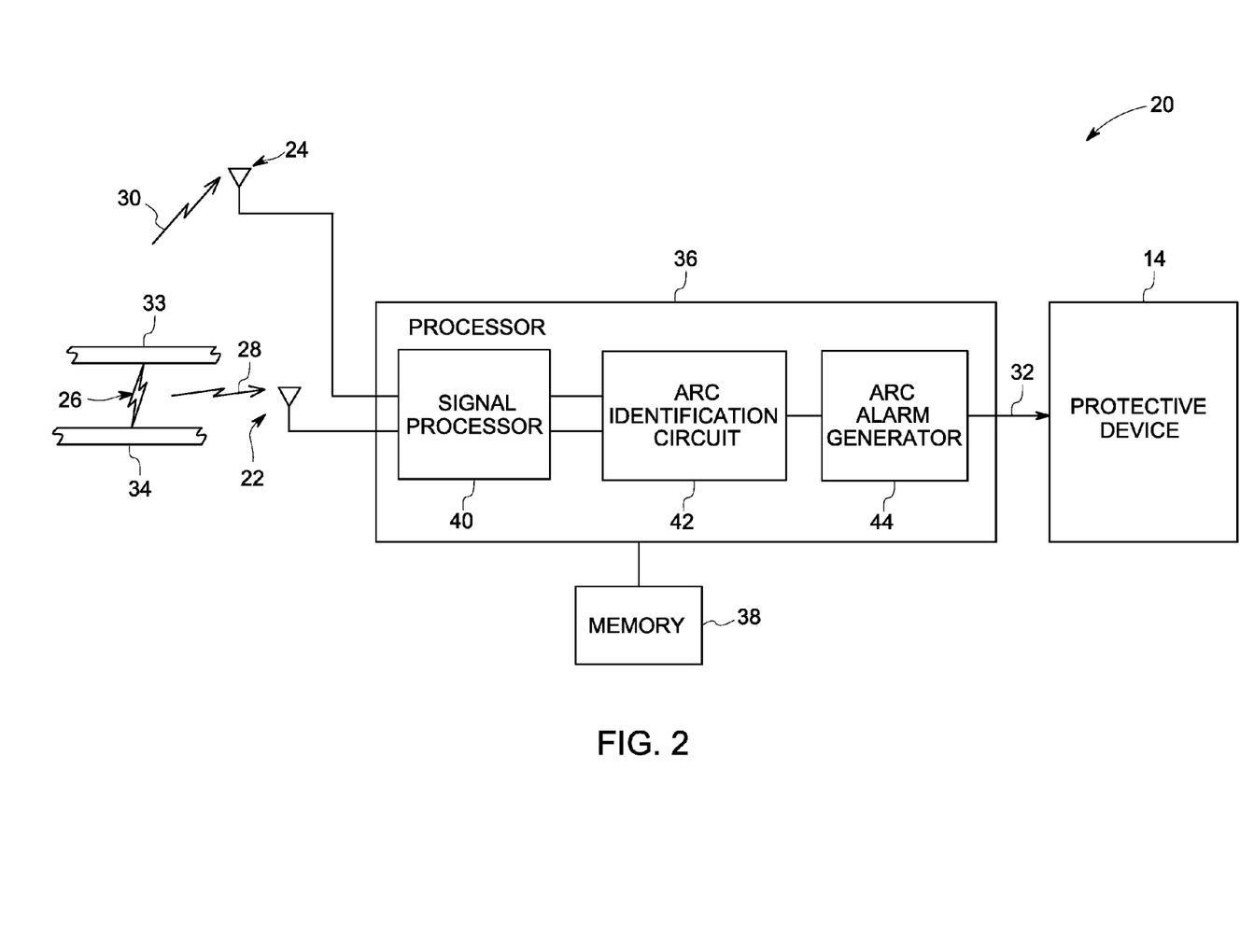
FIG. 2 is a diagrammatical view of one embodiment of the arc flash detection system as implemented in FIG. 1.

FIG. 2 is a block diagram of arc flash detection system 20 described in detail below. The arc flash detection system 20 comprises a processor 36, optical detectors 22, 24 and a memory 38 coupled to the processor. The processor 36 further comprises signal processor 40, arc identification circuit 42 and arc alarm generator 44. Typically an arc flash 26 may occur between bus bars 33 and 34 or between at least one bus bar 33 or 34 and ground. The arc flash emission 28 and 30 comprises plurality of wavelength of light such as ultraviolet, visible and infrared. The optical detectors 22 and 24 are configured to sense the ultraviolet light wavelength of arc flash emission 28 or 30.

In an exemplary embodiment, the arc flash detection system 20 may include a memory 38 for storing at least one pre-determined ultraviolet light characteristic indicative of an arcing event. Pre-determined ultraviolet light characteristic could be an ultraviolet light intensity emitting from the arcing event. A signal processor 40, which is part of the processor 36, is configured to receive signals form optical sensors 22, 24 and extract ultraviolet light characteristics. The processor 36 may further include an arc identification circuit 42, such as a comparator for comparing the extracted ultra violet light characteristic with the pre-determined characteristic stored in the memory 38 to identify the occurrence of an arcing event. The processor 36 may further include an arc alarm generator 44 for generating an arc fault signal indicative of the arcing event. The arc fault signal 32 may be used to control an operation of the electrical distribution system 10 in FIG. 1. For example, the arc fault signal 32 may be used to trigger a protective device 14 to mitigate the arc flash 26 between bus bar 33 and 34.

In another exemplary embodiment, the arc flash detection system 20 may be configured to discriminate between an ultraviolet light emission indicative of an arcing event and background ultraviolet light, if any, herein referred to as noise. At the time of installation, the optical sensors are configured to detect the background (ambient) ultraviolet light and store the corresponding intensity and wavelength as pre-determined characteristic in memory. Note that the predetermined characteristic such as intensity and wavelength may vary depending on the installed location of the optical sensors. However, the characteristics such as ultraviolet light intensity of arc flash are substantially greater than the predetermined characteristic (sometimes as high as five times). Similarly, at the time of installation, the radio frequency sensors are configured to detect the background radio frequency signals (noise) and store them as pre-determined characteristics in memory. Note that the predetermined characteristics of the radio frequency signal may vary depending on the installed location of the radio frequency sensors. However, the characteristics of the radio frequency signal from the arc flash are substantially different than the pre-determined characteristic. As shown in FIG. 2, the system 20 may include a first optical sensor 22 disposed in proximity to the bus bars for sensing a first arc flash emission 28 likely to include ultraviolet light characteristics from arcing event and a second optical sensor 24 disposed in proximity to the bus bars for sensing a second arc flash emission 30 likely to include radio frequency signals. The system 20 may include a signal processor 40 for processing the first arc flash emission 28 and second arc flash emission 30 sensed by optical sensors 22 and 24 respectively to extract the ultraviolet light characteristics of and radio frequency characteristics. The signal processor 40 may be configured to perform a Fourier transform to extract the frequency characteristics from arc flash emission. In another example embodiment, the signal processor 40 may include a filter for extracting frequency characteristics in the desired frequency range such as ultraviolet and radio frequency. The system 20 may also include an arc identification circuit 42 in the form of a discriminator for discriminating the ultraviolet light and radio frequency characteristics with that of the respective predetermined characteristic and noise. The system 20 may also include an arc alarm generator 44 for generating an arc fault signal 32 indicative of an arcing event. The arc fault signal 32 may be used to trigger a protective device 14 to mitigate the arc flash 26 between bus bar 33 and 34.

Figure 3:
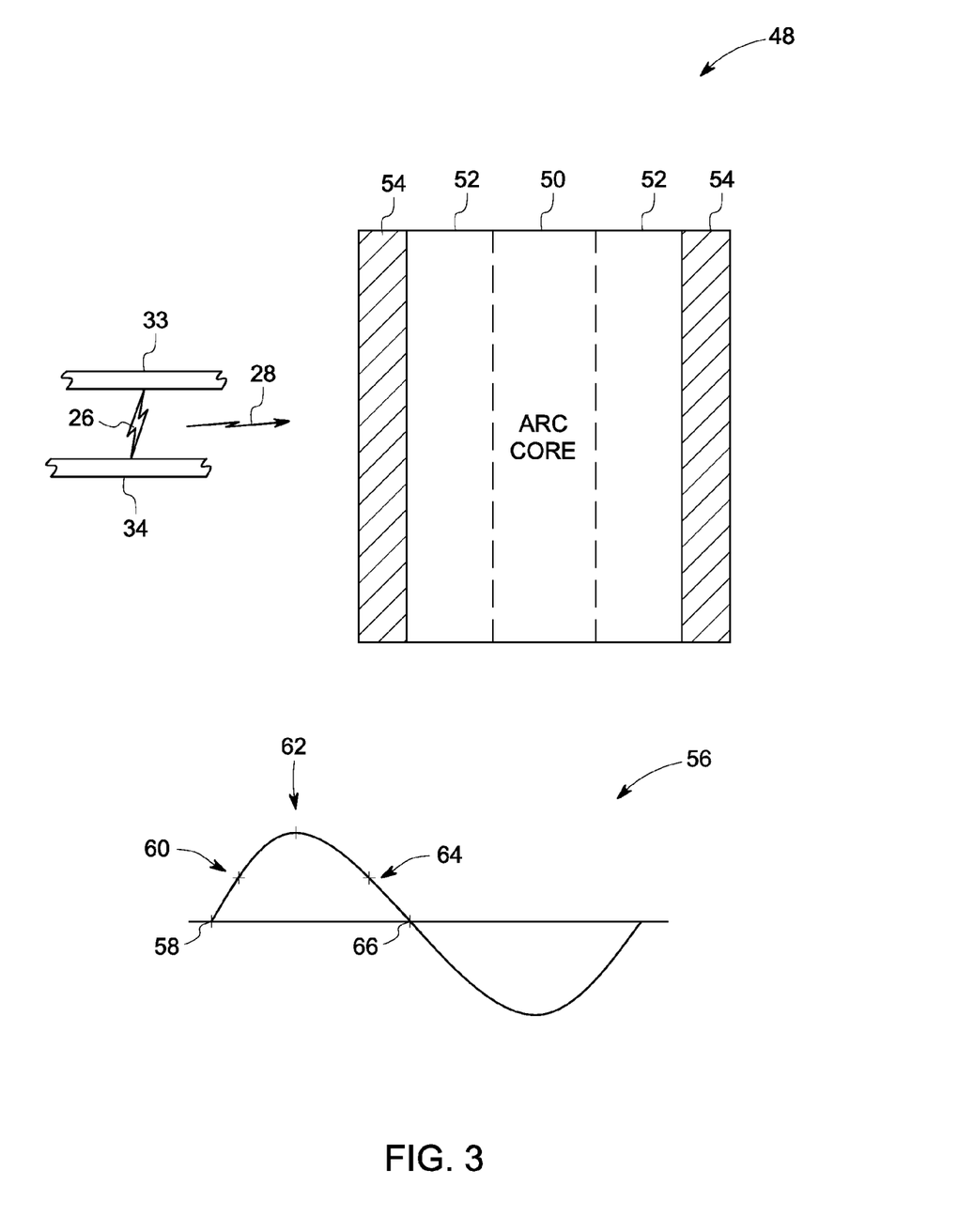
FIG. 3 is a schematic representation of the components of an arc and sinusoidal fault current waveform resulting from an arcing event.

FIG. 3 represents the components 48 of an arc 26 during the occurrence of an arcing event. Typically the arc flash comprises an arc core 50 made up of fully ionized species, a first layer 52 made up of partially ionized species and a second layer 54 made up of un-ionized species. Arc core 50 may emit more ultraviolet light and lower frequency visible or infrared light. The first layer 52 may emit more visible light and lower frequency ultraviolet light. The second layer 54 may emit more infrared and lower frequency visible light.

The characteristics of arc components 48 are determined by the magnitude of electrical energy or current illustrated by a sine wave 56. According to one embodiment of the present invention, the sine wave 56 represents the fault current level in the system during an arcing event. During the inception stage of the arc formation between points 58 and 60 of an arcing event 26, the components of arc 48 may emit more ultraviolet light, indicative of arc core 50. The ultraviolet light intensity decreases and visible light intensity increases as the arc formation progresses. It may be noted that at any point on the sine wave 56, which represents current level in the system, there is a corresponding ultraviolet light intensity. However the magnitude of ultraviolet light intensity captured by the optical sensors may vary in different systems in which such arc detection systems are implemented. Also the location of the sensors with respect to the arcing event influences the intensity of light detected by the optical sensors. According to another embodiment of the present invention, the current level in the system typically represents a peak frequency response characteristic of the radio frequency signal. In the arc propagation region between points 60 and 62, the arc components 48 may constitute the first and second layers 52 and 54. Similarly, the region between points 62 and 64, and points 64 and 66, the arc components 48 may constitute the first and second layers 52 and 54. This is indicative of the formation of arc components with arc core 50 faster than formation of the first and second layers. As will be appreciated by those skilled in the art, detecting ultraviolet light thus provide the earliest indication of an incipient an arcing event.

Figure 4:
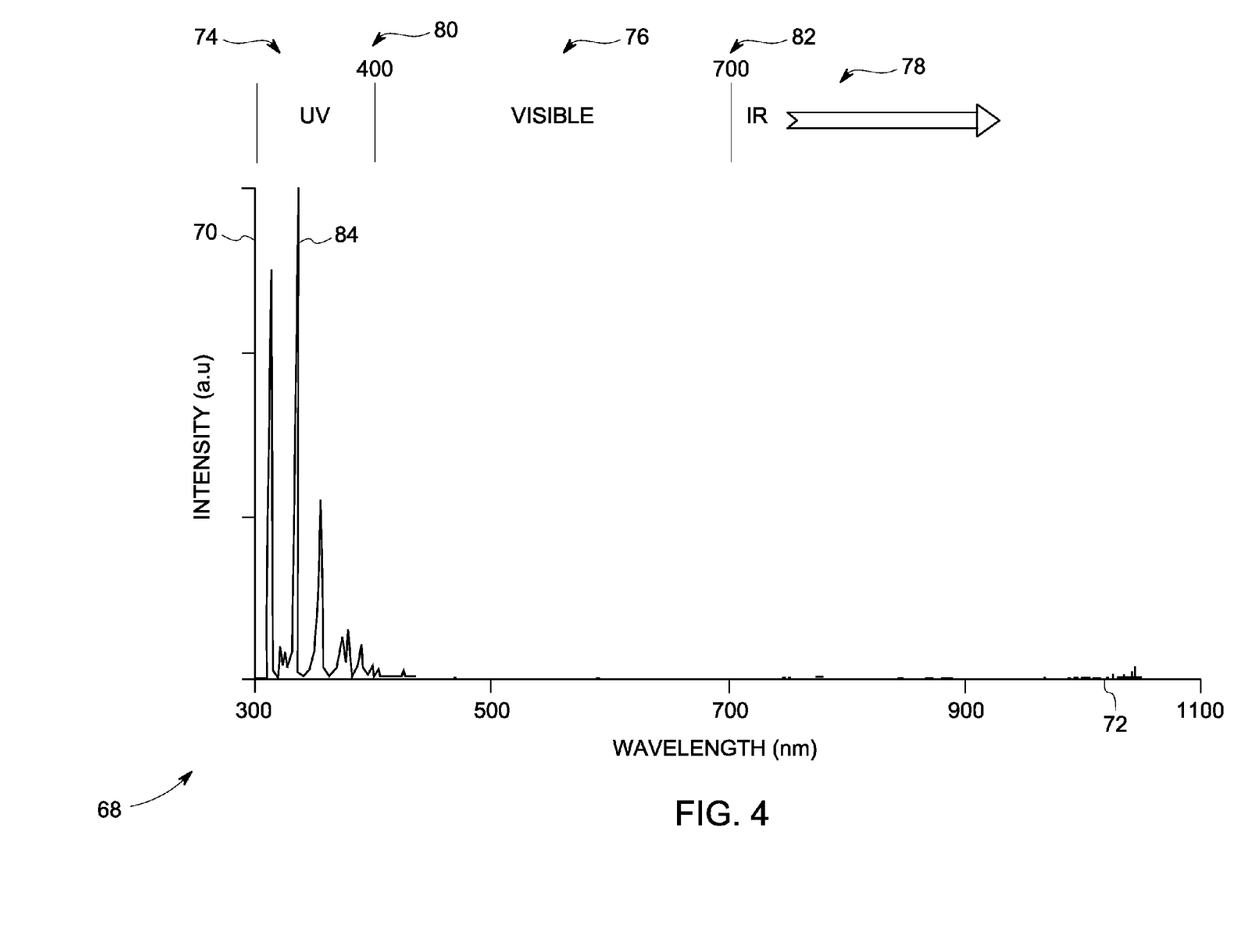
FIG. 4 is a diagrammatical representation is one embodiment of optical spectrum indicative of initial stage of arc flash.

FIG. 4 illustrates an exemplary plot 68 of an optical spectrum with intensity versus wavelength. The y-axis 70 represents light intensity in an arbitrary unit scale and x-axis 72 represents wavelength in a nanometer scale. The optical spectrum may be subdivided into ultraviolet, visible and infrared regions as indicated by reference numerals 74, 76 and 78, respectively. That is, the region 74 with wavelengths between 300 and 400 nanometers (80) represents ultraviolet light, while region 76 with wavelengths between 400 and 700 nanometers (80 and 82) represents visible light, and region 78 with wavelengths between 700 and 1100 nanometers wavelength represents infrared light. The spectral lines 84 represent the experimental observations during the inception stage of the arcing event. The spectral lines 84 represent that ultraviolet light and negligible visible and infrared light 76 and 78 are evident. As will be appreciated, ultraviolet light detection enables early detection of an arcing event, enabling faster reaction to and mitigation of the effects of such events.

Figure 5:
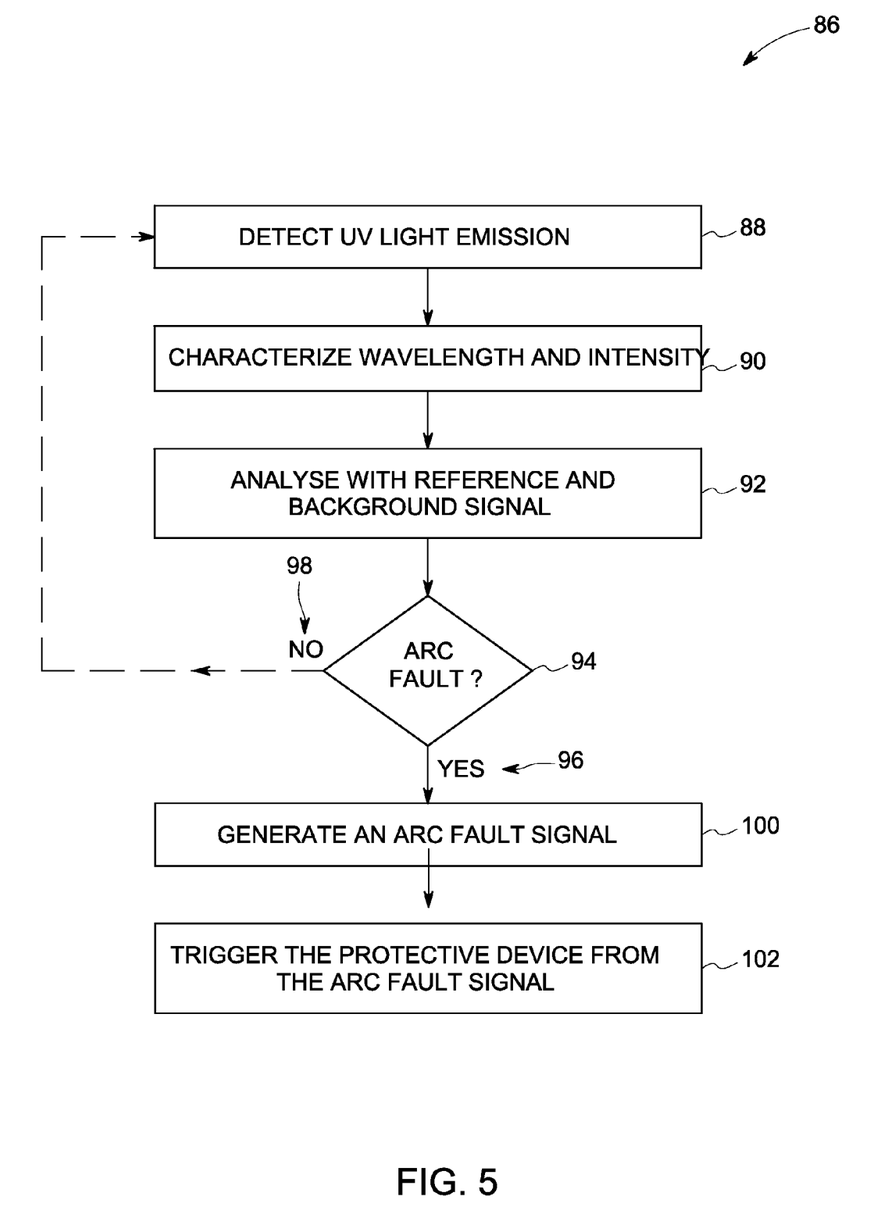
FIG. 5 is a flow chart illustrating an exemplary method of arc flash detection according to an aspect of the present technique.

FIG. 5 illustrates a flow chart 86 indicating an exemplary method of arcing event detection. The first step 88 of the method is the detection of ultraviolet light emission from the arc flash by optical sensors. The signals from the optical sensors are characterized at step 90 for the wavelength and intensity. The wavelength and intensity are analyzed with reference and background signals at step 92. In another embodiment of the present invention, signals from radio frequency sensors are used to characterize the frequency of received radiation independently. The processor analyzes both the signals from optical sensors and radio frequency sensors, and verifies occurrence of arc flash before generating arc fault signal. Such combined analysis of signals from both the optical and radio frequency sensors enables avoidance of erroneous or nuisance arc fault signals. For example, when no arc flash has actually occurred, one of the sensors may generate a signal, while the other does not generate a fault-indicating signal, and in such conditions, the processor is configured not to generate arc fault signal. Such incidents may occur under special circumstances such as natural lighting. Both the signals from optical sensors and those from the radio frequency sensors contribute to the decision of classification of an event as one of occurrence of arc flash. Signals from optical sensors and radio frequency sensors are used in conjunction to characterize detected events and to determine whether an arc flash has occurred. The reference and background signals, or digitized values corresponding to these signals, are characteristics of the arcing event and noise, respectively, and are stored in memory. The comparison and/or discrimination may verify whether an arcing event has occurred, as indicated at step 94. That is, the signal or value levels may be compared to a threshold that is used to classify the event as an arcing event requiring action, or simply as noise. In case of an arcing event, as indicated by reference numeral, the processing circuitry generates arc fault signal or alarm, as indicated by reference numeral 100. The arc fault signal or alarm 100 triggers the protective device, as indicated at reference numeral 102 to mitigate the arcing event (e.g., open the circuit). In the absence of an arcing event at point 98, no arc fault signal is generated, and the system may continue normal operation by returning to point 88.

It should be noted that as referred to herein, ultraviolet light may be defined as electromagnetic radiation with a wavelength shorter than that of visible light (<400 nm). Common sources of ultraviolet light include the sun, synchrotron radiation sources, mercury or xenon arc lamps, and gaseous discharge tubes filled with gas atoms such as mercury, deytrerium and hydrogen, whose internal electron energy levels correspond to the photons of ultraviolet light. In addition, electrical systems of the type discussed herein can generate corona, which is another source of ultraviolet light.

Benefits and utilities of the invention include early detection of ultraviolet light that represents an inception stage of an arcing event, enabling faster mitigation of the ill effects of the arcing event.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for identifying an arcing event in electrical distribution system comprising:
   a sensor configured to detect ultraviolet light and to generate a signal indicative of the arcing event propagating from the electrical distribution system;
   a processor coupled to the sensor and configured to analyze an ultraviolet light characteristic from the signal and to generate an arc fault signal indicative of the arcing event; and
   a protective device configured to receive the arc fault signal and to mitigate the arcing event in the electrical distribution system.

2. The system of claim 1, wherein the processor is configured to analyze the ultraviolet light characteristic from the signal by comparing the ultraviolet light characteristic with a pre-determined ultraviolet light characteristic, identifying an occurrence of the arcing event.

3. The system of claim 1, wherein extracted ultraviolet light characteristic is indicative of wavelength and intensity.

4. The system of claim 2, wherein the pre-determined ultraviolet light characteristic is indicative of low intensity light signal from ultraviolet wavelength.

5. The system of claim 1, wherein the sensor is disposed in electrical distribution system.

6. The system of claim 1, wherein the sensor comprises a fiber optic sensor or a photo-diode sensor.

7. The system of claim 1, further comprising a memory for storing the pre-determined ultraviolet light characteristic indicative of a noise.

8. An arc detection system for identifying an arcing event within an electrical distribution system comprising:
   a plurality of optical sensors disposed proximate to the electrical distribution system and configured to sense an ultraviolet light and to generate a first signal indicative of the arcing event in the electrical distribution system;
   a plurality of radio frequency sensors disposed proximate to the electrical distribution system and configured to sense a radio frequency signal indicative of the arcing event generated in the electrical distribution system;
   a processor coupled to the optical sensors and to the radio frequency sensors, the processor being configured to extract an ultraviolet light characteristic from first signal, and a radio frequency characteristic from the radio frequency signal, and to compare the extracted ultraviolet light characteristic and the extracted radio frequency characteristic to a pre-determined characteristic to identify occurrence of the arcing event, and to generate an arc fault signal; and
   a protective device configured to receive the arc fault signal and to mitigate the arcing event in the electrical distribution system.

9. The system of claim 8, wherein the ultraviolet light characteristic and the radio frequency characteristic are indicative of frequency and intensity.

10. The system of claim 8, wherein the optical sensors and the radio frequency sensors are disposed in a plurality of locations around the electrical distribution system.

11. The system of claim 8, wherein the processor is configured to discriminate noise from the first signal and radio frequency signal.

12. A method for identifying an arcing event in electrical distribution system comprising:
   detecting ultraviolet light and generating a signal indicative of the arcing event in the electrical distribution system and propagating from electrical distribution system;
   extracting an ultraviolet light characteristic from the signal;
   comparing the extracted ultraviolet light characteristic to a pre-determined ultraviolet light characteristic to identify occurrence of the arcing event; and
   generating an arc fault signal indicative of occurrence of the arcing event.

13. The method of claim 12, further comprising using the arc fault signal to initiate protective action to mitigate the arcing event.

14. The method of claim 12, wherein the pre-determined ultraviolet light characteristic comprises a peak ultraviolet light intensity indicative of an arcing event.

15. The method of claim 12, further comprising disposing a sensor configured for detecting ultraviolet light proximate a region of the electrical distribution system likely to experience arcing.

16. The method of claim 12, further comprising relating the pre-determined ultraviolet light characteristic to a current present in the electrical distribution system.

17. The method of claim 12, further comprising discriminating the extracted ultraviolet light characteristics from noise.

18. The method of claim 12, further comprising triggering a protective device based upon the arc fault signal.

19. A method for identifying an arcing event in electrical distribution system comprising:
   detecting ultraviolet light and generating a first signal indicative of the arcing event;
   detecting a radio frequency signal indicative of the arcing event;
   extracting an ultraviolet light characteristic from the detected first signal and a radio frequency characteristic from the detected radio frequency signal;
   comparing the extracted ultraviolet light characteristic and the extracted radio frequency characteristic with pre-determined characteristics to identify occurrence of an arcing event; and
   generating an arc fault signal indicative of occurrence of the arcing event.

20. The method of claim 19, further comprising using the arc fault signal to initiate protective action for the arcing event.

21. The method of claim 19, wherein the pre-determined ultraviolet light characteristic comprises a peak ultraviolet light intensity indicative of an arcing event.

22. The method of claim 19, further comprising disposing an optical sensor for detecting ultraviolet light and a radio frequency sensor for detecting radio frequency signal proximate a region of the electrical distribution system likely to experience arcing.

23. The method of claim 19, further comprising relating the pre-determined ultraviolet light characteristic and the pre-determined radio frequency characteristic to a current present in the electrical distribution system.

24. The method of claim 19, further comprising discriminating the extracted characteristics from noise.

25. The method of claim 19, further comprising triggering a protective device by the arc fault signal.

* * * * *

UNITED STATES PATENT AND TRADEMARK OFFICE
CERTIFICATE OF CORRECTION

PATENT NO.        : 7,580,232 B2                                          Page 1 of 1
APPLICATION NO.   : 11/962384
DATED             : August 25, 2009
INVENTOR(S)       : Caggiano et al.

It is certified that error appears in the above-identified patent and that said Letters Patent is hereby corrected as shown below:

On the Title Page, in Field (75), under "Inventors", in Column 1, Line 3, delete "Murphy" and insert -- Murthy --, therefor.

Signed and Sealed this

First Day of December, 2009

David J. Kappos
*Director of the United States Patent and Trademark Office*